(12) United States Patent
Weiblen et al.

(10) Patent No.: US 7,064,403 B2
(45) Date of Patent: Jun. 20, 2006

(54) CHIP ASSEMBLY IN A PREMOLD HOUSING

(75) Inventors: Kurt Weiblen, Metzingen (DE); Michael Arndt, Reutlingen (DE); Ronny Ludwig, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 74 days.

(21) Appl. No.: 10/832,534

(22) Filed: Apr. 26, 2004

(65) Prior Publication Data

US 2005/0179102 A1    Aug. 18, 2005

(30) Foreign Application Priority Data

Apr. 24, 2003  (DE) ............................. 103 18 501

(51) Int. Cl.
*H01L 27/14* (2006.01)
*G01J 5/00* (2006.01)

(52) U.S. Cl. ..................... 257/428; 250/338.1

(58) Field of Classification Search ................ 257/428, 257/433, 467; 250/339.02, 338.4
See application file for complete search history.

(56) References Cited

U.S. PATENT DOCUMENTS

| 4,567,006 | A | * | 1/1986 | Covington et al. ......... 264/459 |
| 4,772,790 | A | * | 9/1988 | Aldridge ..................... 250/343 |
| 5,721,430 | A | * | 2/1998 | Wong .................... 250/339.13 |
| 5,962,854 | A | * | 10/1999 | Endo .......................... 250/349 |
| 2003/0118076 | A1 | * | 6/2003 | Schieferdecker et al. ... 374/121 |
| 2005/0030628 | A1 | * | 2/2005 | Wagner et al. .............. 359/573 |

* cited by examiner

*Primary Examiner*—Matthew S. Smith
*Assistant Examiner*—Lex H. Malsawma
(74) *Attorney, Agent, or Firm*—Kenyon & Kenyon, LLP

(57) ABSTRACT

A invention relates to a device for detecting incident radiation in the infrared range, including at least one chip assembly for detecting infrared radiation, at least one bonding wire, which starts out from the chip assembly and runs through metallic terminals to the exterior of the housing, as well as passivation material, which is distributed in such a manner, that the at least one bonding wire is, in essence, completely enclosed by the passivation material, and a surface region of the chip assembly facing the incident, infrared radiation is not enclosed by the passivation material.

14 Claims, 5 Drawing Sheets

CHIP ASSEMBLY IN A PREMOLD HOUSING

BACKGROUND INFORMATION

Conventional micromechanical thermopile sensors having an infrared filter for gas analysis are installed in TO05 housings or TO08 housings. In this context, the thermopile element is seated on the base of the housing, while the filters are bonded in the TO cap. This type of housing is very expensive, and the bonding wires are mostly not passivated, which calls into question the suitability for automotive applications, due to the condensation and corrosion that is consequently possible. So-called premold housings are well known for sensors highly sensitive to mechanical stresses. In this case, they are extruded or molded, plastic housings. In this connection, the sensor element is directly fastened in the premold housing (bonded or soldered in the case of an available, solderable chip-mounting surface). An electrical contact is produced by wire-bonding connections. In order to provide passivation, the premold housing is then completely encapsulated with gel or epoxy resin and/or closed with a cover. Since it is possible for passivation of the chip surface, or for a cover that is possibly transparent in the frequency range of interest (in the case of IR radiation, e.g. wavelengths $\geq 4000$ nm) not to be sufficiently transparent over its entire lifetime ("loss of sight", discoloration due to the action of temperature, moisture absorption, . . . ), optical access to the sensor is not permanently ensured. In addition, any diffusion or insertion of gas molecules into the passivation material above the chip represents a possible problem for a gas sensor. Housings for integrated circuits (IC housings) having an exposed, chip-mounting surface on the back side (also referred to as a die pad; if the chip-mounting surface is exposed, then the chip-mounting surface is also referred to as an exposed die pad) are known for power IC's.

SUMMARY OF THE INVENTION

The present invention relates to a device for detecting incident radiation in the infrared range, including
  at least one chip assembly for detecting infrared radiation,
  at least one bonding wire, which starts out from the chip assembly and runs through electrically conductive, i.e. metallic terminals to the exterior of the housing, as well as
  passivation material, which is distributed in such a manner,
  that the at least one bonding wire (406) is completely enclosed or, in essence, completely enclosed by the passivation material, and
  a surface region of the chip assembly facing the incident, infrared radiation is not enclosed by the passivation material. Consequently, a smaller amount of the passivation material is needed than in the case of a completely encapsulated chip. In addition, the fact that the active chip surface is not passivated allows the use of a passivation material that is not transparent in the wavelength range of interest. This allows scattered radiation to be avoided. Furthermore, the fact that the active chip surface is not passivated prevents having to use a second penetration materially specifically for the chip surface.

An advantageous refinement of the present invention is characterized in that the chip assembly is accommodated in a preformed housing. This eliminates the need for subsequent extrusion-coating of the chip with plastic.

An advantageous refinement of the present invention is characterized in that the preformed housing has a geometric structure, which runs around the inner wall or at least part of the inner wall of the housing and is shaped in such a manner, that it is not traversed by the passivation material as a result of passivation-material creep, which is caused by wetting forces or adhesion forces between the passivation material and the inner wall of the housing and leads away from the base of the housing. This allows the desired amount of passivation material to be exactly applied to the desired locations.

An advantageous refinement of the present invention is characterized in that
  a passivation gel is used as a passivation material, and
  the geometric structure running around the inner wall of the housing is a stopping edge, in particular a gel stopping edge.

The passivation gel is a known and easily manipulable material.

An advantageous refinement of the present invention is characterized in that the geometric structure running around the inner wall of the housing (in particular a radial cross-section of this structure) has at least one acute angle. This acute angle is simple to produce in the preformed housing and, therefore, provides a simple option for producing a stopping edge.

An advantageous refinement of the present invention provides for the geometric structure running around the inner wall of the housing (i.e. a radial cross-section of this structure) to have at least two acute angles. This allows one to achieve redundancy in the stopping function for the passivation.

An advantageous refinement of the present invention is characterized in that a radial cross-section of the geometric structure running around the inner wall of the housing has at least one angle, upon traversal of which the passivation material travels around an angle greater than 270 degrees.

An advantageous refinement of the present invention is characterized in that
  the preformed housing is open to one side, and
  the open side of the preformed housing is enclosed by a metal cover, which has at least one opening.

This provides additional mechanical protection to the wire-bonding connection.

An advantageous refinement of the present invention is characterized in that the cover and the chip assembly are positioned in such a manner, that the incident, infrared radiation initially passes through the opening of the cover and subsequently reaches the surface region of the chip assembly not enclosed by the passivation material.

An advantageous refinement of the present invention is characterized in that
  at least one opening of the cover is assigned a filter, and
  this filter is distinguished by the fact that, in essence, only infrared radiation in a predefined wavelength range is allowed through.

An advantageous refinement of the present invention is characterized in that
  the filter takes the form of a Fabry-Perot filter, and
  the filter only transmits infrared radiation in the wavelength range about an absorption band of a gas to be detected.

In this manner, gas analysis presents itself as a particularly suitable field of application for the set-up.

An advantageous refinement of the present invention is characterized in that the device has at least two chip superstructures for detecting infrared radiation, and
in each of the at least two chip superstructures, one surface region of the chip assembly facing the incident, infrared radiation is not covered by passivation material.

This allows the option of comparing the intensity of infrared radiation detected by one chip assembly to the intensity of the infrared radiation detected at another chip assembly.

An advantageous refinement of the present invention is characterized in that the device
has at least two Fabry-Perot filters, and
at least one of the filters only transmits infrared radiation in the wavelength range about an absorption band of a gas to be detected, and
at least one other of the filters only transmits infrared radiation in a wavelength range different from the wavelength range about the absorption band of the gas to be measured.

An advantageous refinement of the present invention is characterized in that the gas to be detected is carbon dioxide. In this manner, the set-up is suitable for detecting carbon dioxide, and, when carbon-dioxide-based air-conditioning systems are used in motor vehicles, the set-up may be used for detecting leaks in the air-conditioning system.

An advantageous refinement of the present invention is characterized in that the chip assembly has at least one thermopile. The thermopile provides the simple and reliable option of detecting temperature differences caused by radiation, on the basis of an electrical voltage caused by it (this is the physical Seebeck effect).

An advantageous refinement of the present invention is characterized in that
the chip assembly has at least one cavity, which is covered by a self-supporting diaphragm, and
the thermopile is attached to the side of the diaphragm opposite to the cavity.

The cavity provides an effective option for preventing the heat transfer from the thermopile from being too rapid.

DETAILED DESCRIPTION

The present invention includes the passivation (passivation=shielding or generation of insensitivity to external influences) of the bonding contacts of a stepped chip assembly in a premold housing, using a passivation-material stopping edge, which is adapted to the height of the chip, and runs around the inner walls of the premold housing (when a gel is used as a passivation material, then the stopping edge is a so-called gel stopping edge). In this context, the upper chip edges simultaneously act as chip-side stopping edges. An exact dosage of the amount of the passivation agent (e.g. the passivation gel) prevents the active chip surface from being passivated as well. This assembly is mechanically protected by a metal cover having openings.

Because the chip surface is not passivated, the best possible, optical accessibility of the chip surface during the entire life of the assembly is achieved.

When selecting the passivation material, it is advisable to use a passivation material that is not transparent in the wavelength range of interest (e.g. black gel), in order to avoid scattered radiation.

In addition, this yields the following advantages:
Simple and cost-effective assembly is possible (in particular, for chips sensitive to mechanical stresses).
It is not necessary to extrusion-coat the chip with plastic.
All of the bonds are passivated, i.e. both the wire bonds and the chip connections.
A lesser amount of passivation material is necessary in comparison with the complete encapsulation of a chip. This reduces the mechanical stresses on the wire-bonding connections.
The chip size may be minimized, which allows the manufacture of more cost-effective, smaller chips.
The set-up provides a housing suitable for applications in the automotive industry.
The fact that the active chip surface is not passivated allows the use of a passivation material that is not transparent in the wavelength range of interest. This allows scattered radiation to be avoided.
The fact that the active chip surface is not passivated prevents having to use a second penetration material specifically for the chip surface.
There is the option of thermally coupling the set-up to the substrate by using a housing variant having an exposed die pad. This allows the possibility of heat transfer (heat sink).
It is possible to additionally protect the wire-bonding connections and the passivation by attaching an additional metal cover (lid) having openings.
This additional metal cover allows further shielding against scattered radiation.

Furthermore, this allows the simple possibility of further processing by automatic machines having special pick-up tools. In addition, it is possible to mount external and expanded optical filters.

Figure 1:
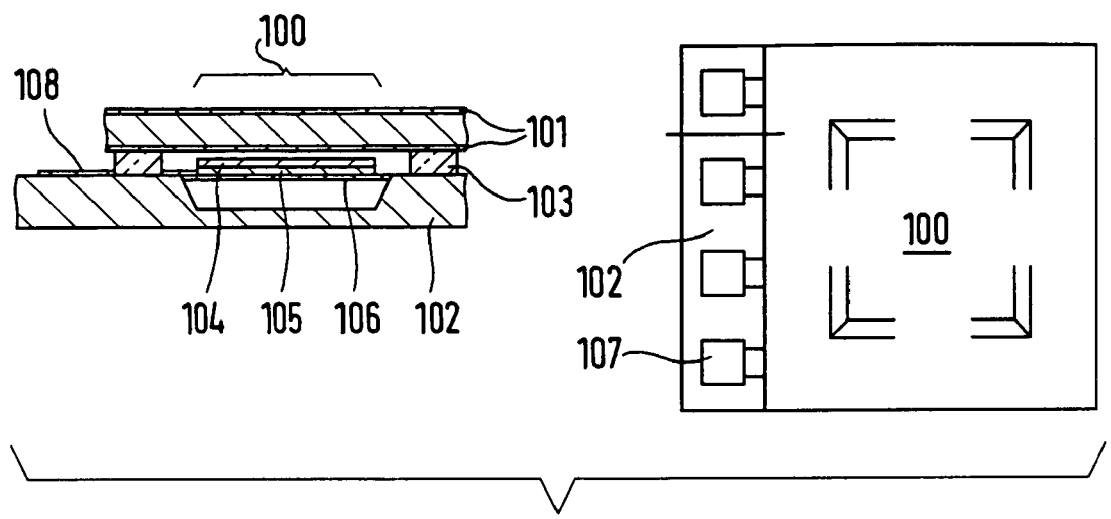
FIG. 1 shows the fundamental chip design of an infrared sensor.

The basic chip design of an infrared sensor is represented in FIG. 1. A side view is shown on the left, and the plan view from above is shown on the right. In this context, brace 100 denotes the width of the optically relevant region. The filter wafer having the filter layers applied to one or both sides of it is denoted by 101, and the carrier chip of the set-up is denoted by 102. The filter layers take the form of, e.g. Fabry-Perot filters, so that only a certain, specifiable wavelength range (e.g. localized about the absorption peak of carbon dioxide) is transmitted. Filter wafer 101 having the filter layers 102 is joined to carrier chip 102 via a sealed glass connection 103. In addition, 104 denotes the absorber layer, 105 denotes the thermopile, and 106 denotes the diaphragm. The conductor track is indicated by 108. Bonding leads 107 (chip bonding lands) are also contained in it. The hollow space (cavity) between diaphragm 106 and carrier chip 102 can easily be seen in FIG. 1, as well.

Figure 2:
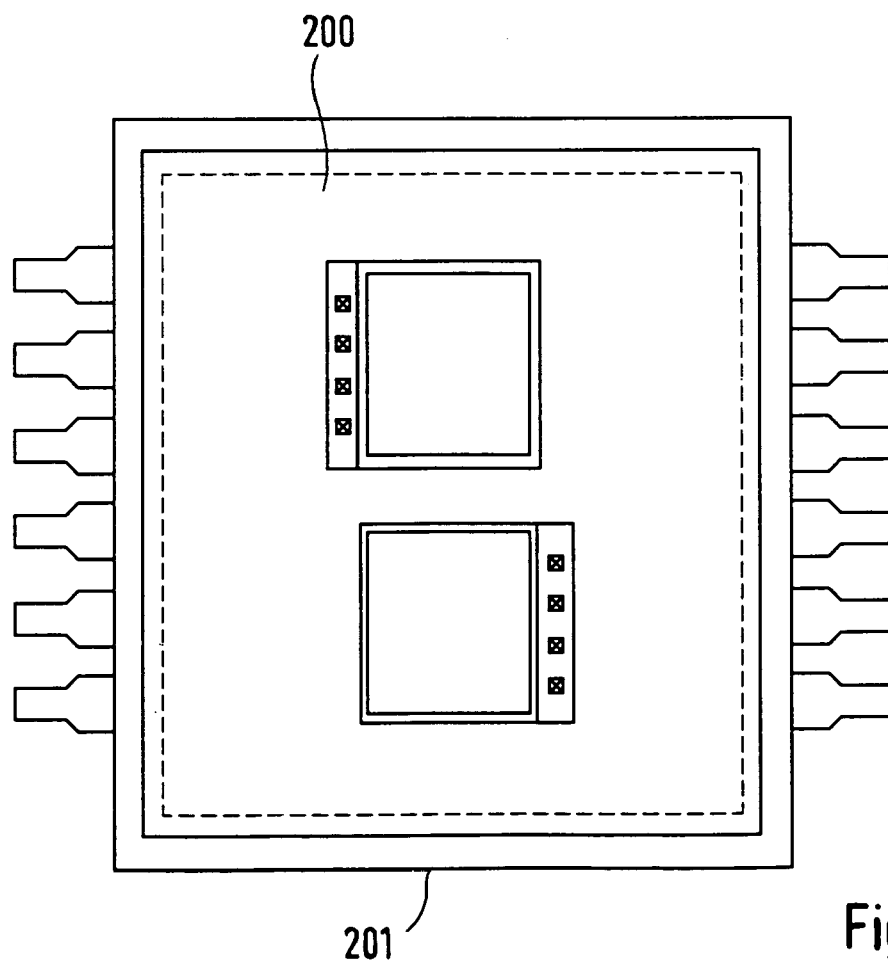
FIG. 2 shows the plan view of a specific embodiment of the device according to the present invention.

The plan view of a specific embodiment of the device according to the present invention is depicted in FIG. 2. In this context, 200 denotes the metal cover having the openings and 201 denotes the plastic premold housing. In this specific embodiment, two openings are provided in the metal cover.

Figure 3:
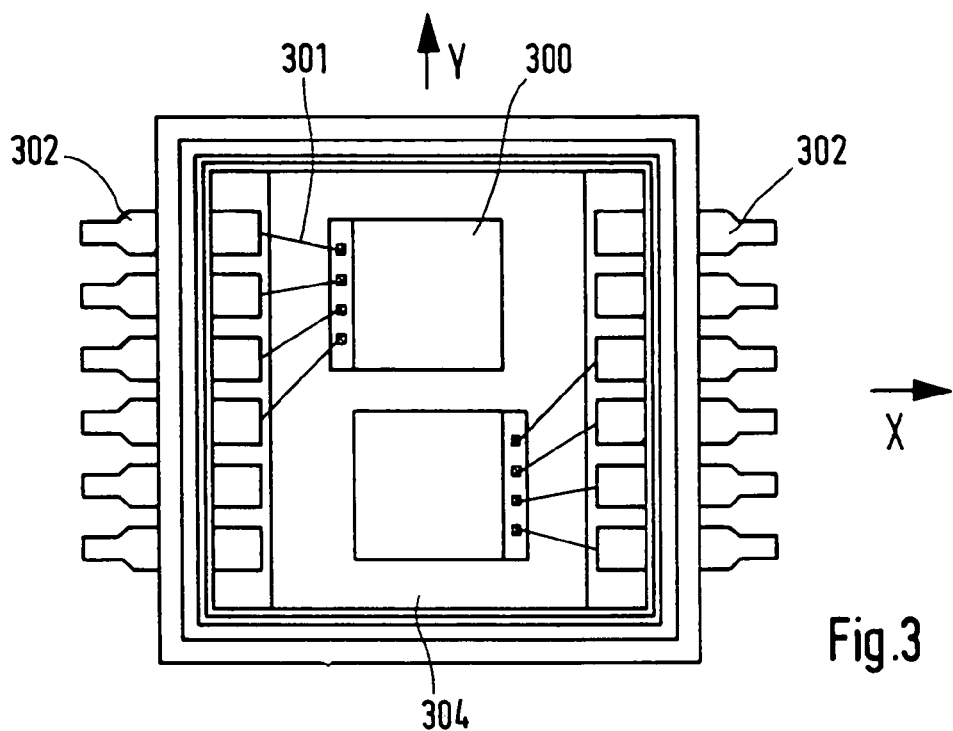
FIG. 3 shows a plan view of the specific embodiment represented in FIG. 2, after removal of the metal cover.

FIG. 3 shows a plan view of the specific embodiment represented in FIG. 2, after removal of the metal cover. In this context, 300 denotes the two chip superstructures (each is situated underneath the opening in the metal cover). In a special embodiment, these take the form of two infrared detectors. Reference numeral 301 indicates the wire bonds to be passivated, and 302 denotes the terminal legs of the component. Reference numeral 304 denotes the plastic housing.

In addition, two axes x and y are drawn into FIG. 3. These define cross-sectional directions. Reference is later made to these axes.

Figure 4:
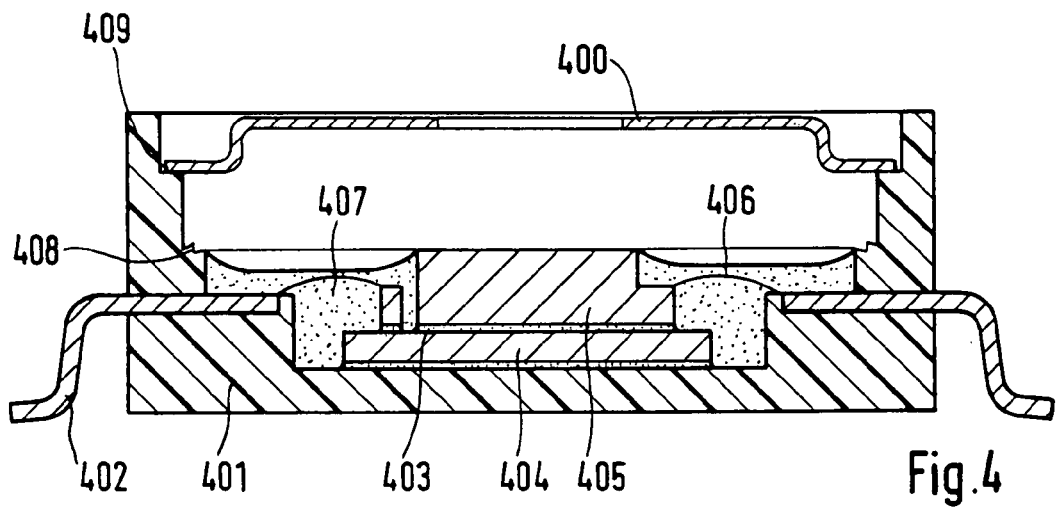
FIG. 4 shows a cross-section of specific embodiment 1.
Figure 5:
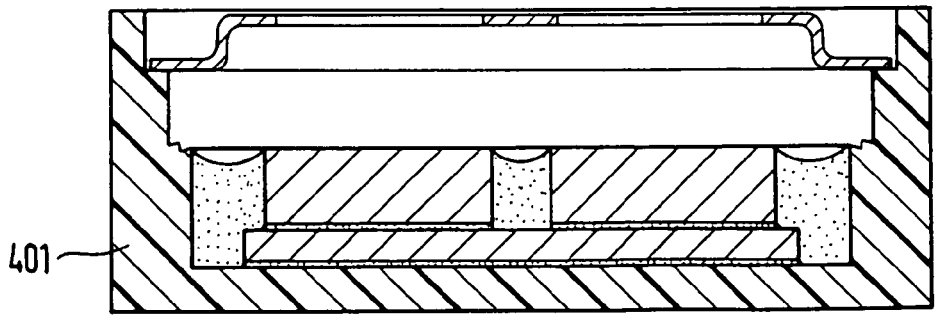
FIG. 5 shows a cross-section of specific embodiment 1, rotated by 90 degrees.
Figure 6:
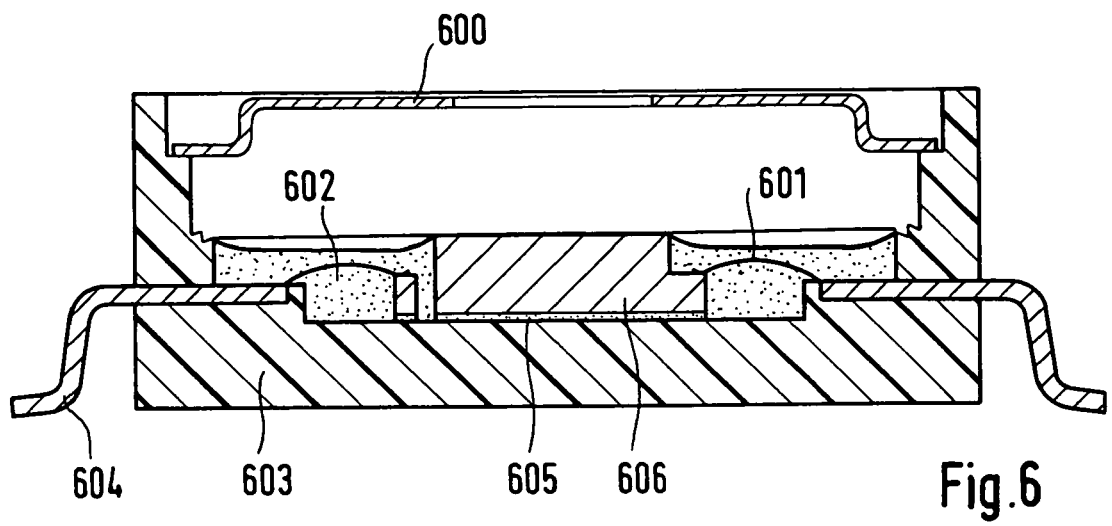
FIG. 6 shows a cross-section of specific embodiment 2.
Figure 7:
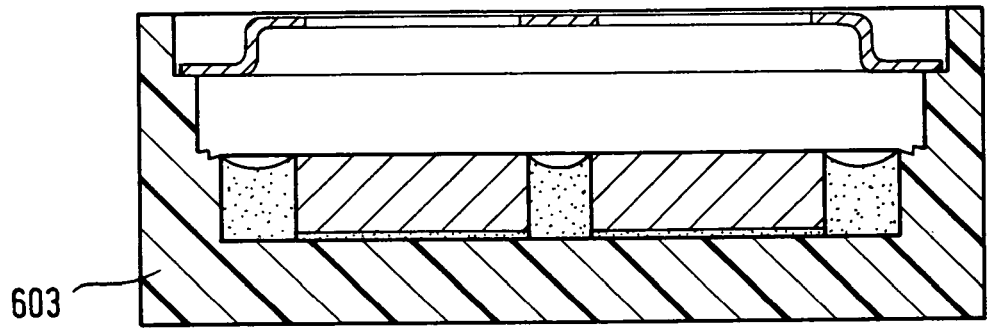
FIG. 7 shows a cross-section of specific embodiment 2, rotated by 90 degrees.
Figure 8:
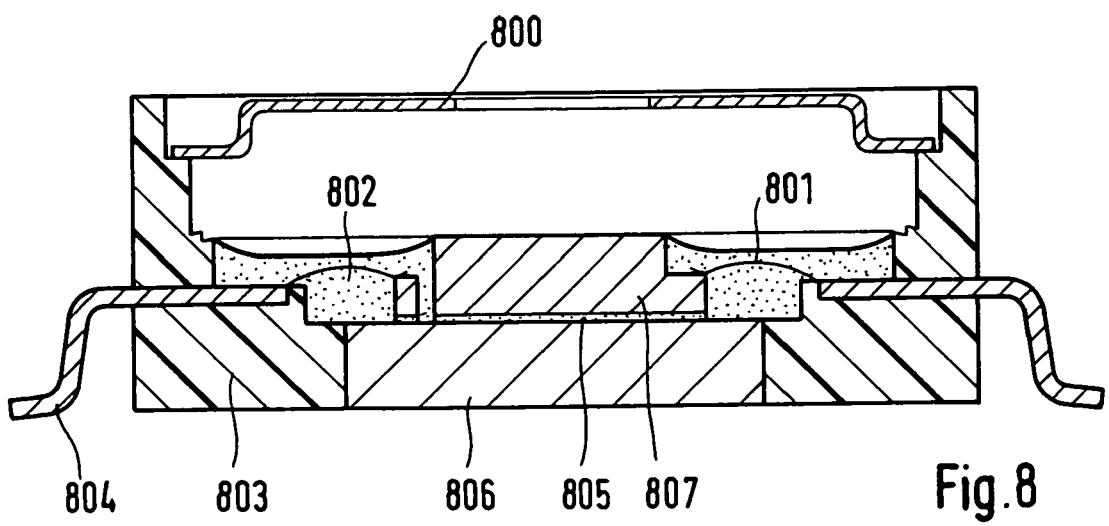
FIG. 8 shows a cross-section of specific embodiment 3.
Figure 9:
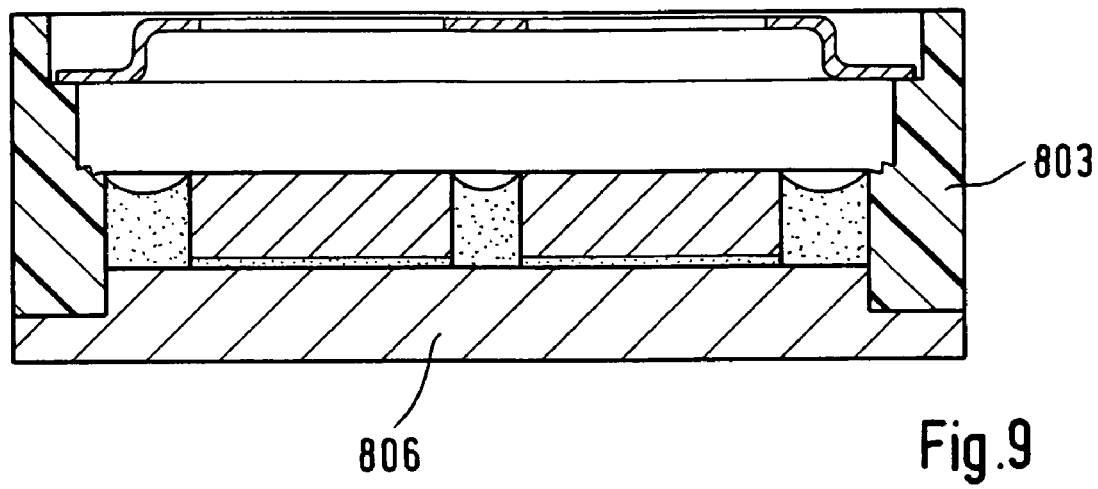
FIG. 9 shows a cross-section of specific embodiment 3, rotated by 90 degrees.

Three exemplary embodiments of the set-up according to the present invention are considered in the following.
Exemplary Embodiment 1: FIG. 4 and FIG. 5
Exemplary Embodiment 2: FIG. 6 and FIG. 7
Exemplary Embodiment 3: FIG. 8 and FIG. 9

In each of the 3 exemplary embodiments, the first figure shows a cross-section through the x direction defined in FIG. 3, and the second figure shows a cross-section in the y direction defined in FIG. 3.

FIG. 4 shows a cross-section of a first specific embodiment of FIG. 3 in the x direction. This specific embodiment is distinguished by a thin housing base, i.e. a maximum inner-chamber height is available. In this context, 400 denotes the metal cover having openings and 401 denotes the plastic housing (premold housing). In addition 402 denotes the external terminal legs. Chip support or base 404 and chip superstructure 405 are joined by an adhesive connection 403. In addition, 406 indicates the wire bonds and 407 denotes the passivation material. The stopping edge for the passivation material is indicated by 408. The function of base 404 is to compensate for the level of chip superstructure 405 as a result of the thin housing base.

FIG. 5 shows a cross-section of the first specific embodiment of FIG. 3 in the y direction. In this case, the two chip superstructures can be seen, which each belong to a separate infrared sensor, i.e. two infrared sensors are present.

Stopping edge 408 prevents the passivation gel from rising up along the vertical housing wall. The automatic "rising" of the gel on the housing wall causes a volume of gel to be lost for the passivation, which can result in the wire bonds no longer being completely enclosed by passivation material. If the passivation material even rises up to set-on part 409 of metal cover when the stopping edge is not present, then the height of the cover level would no longer be correct. The chip edge acts as a natural stopping edge on the inside of the wire bonds (in the chip assembly): the chip surface remains free of passivation material.

A second specific embodiment is represented in FIGS. 6 and 7. FIG. 6 shows a cross-section along the x direction defined in FIG. 3, and FIG. 7 shows a cross-section along the y direction defined in FIG. 3. In a manner analogous to FIG. 4, the following reference numerals denote:
600=metal cover having openings,
601=wire bonds,
602=passivation agent or passivation gel,
603=plastic premold housing,
604=terminal legs
605=adhesive connection, and
606=chip superstructure.

The essential difference from the first variant in FIG. 4 is that the premold housing has a thick housing base. Therefore, the height of the interior chamber is reduced in comparison with FIG. 4, the sensor chips are directly mounted or bonded to the base of the plastic housing, and the use of chip substrate 404 in FIG. 4 may be eliminated.

A third specific embodiment is represented in FIGS. 8 and 9. FIG. 8 shows a cross-section along the x direction defined in FIG. 3, and FIG. 9 shows a cross-section along the y direction defined in FIG. 3. In a manner analogous to FIG. 4, the following reference numerals denote:
800=metal cover having openings,
801=wire bonds,
802=passivation agent or passivation gel,
803=plastic premold housing,
804=terminal legs
805=adhesive connection, and
806=exposed die pad.

Reference numeral 806 denotes the metallic housing base (exposed die pad), and chip superstructure 807 is directly mounted or bonded to the exposed die pad. This provides an optimal thermal coupling of the sensor chips to the printed circuit board.

Figure 10:
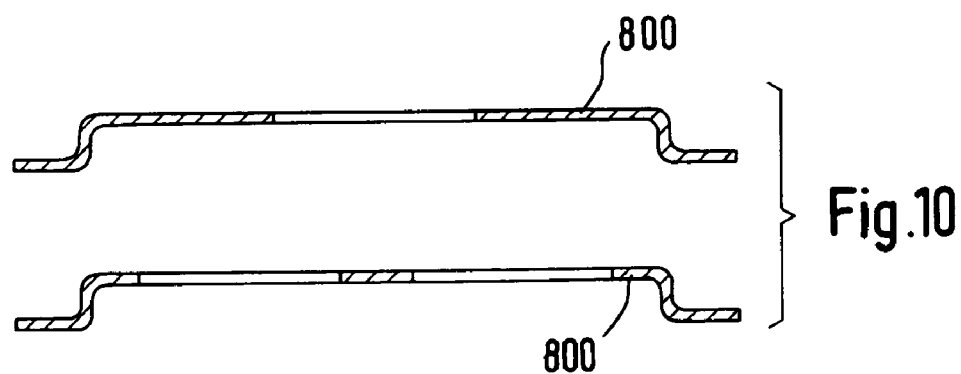
FIG. 10 shows two cross-sections of the metal cover.

A possible metal cover is represented in FIG. 10. The upper cross-section shows a cross-section along the x direction defined in FIG. 3, and the lower cross-section shows a cross-section along the y direction defined in FIG. 3.

Figure 11:
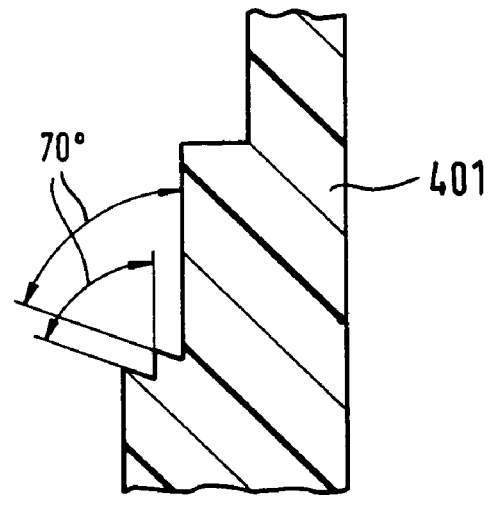
FIG. 11 shows an enlarged detail of a specific embodiment of the stopping edge for the passivation material (e.g. gel) in the premold housing.

FIG. 11 shows an example of the shape of the circumferential gel stopping edge in the premold housing. Reference is made here to the exemplarily selected values of 70 degrees for the two drawn-in angles. An angle of 90 degrees would likewise satisfy the function of a stopping edge. However, a 90 degree edge is not exactly manufacturable due to the manufacturing tolerances in the case of premold housings. If the angle were to be, for example (as a result of manufacturing tolerances), 100 degrees instead of 90 degrees, then the stopping function with regard to an upward flow of the gel would no longer be satisfied. Therefore, it is advisable to select an angle of, e.g. 70 degrees, in order to be on the safe side. That is, even with the present manufacturing tolerances, the angle will certainly be markedly less than 90 degrees.

Figure 12:
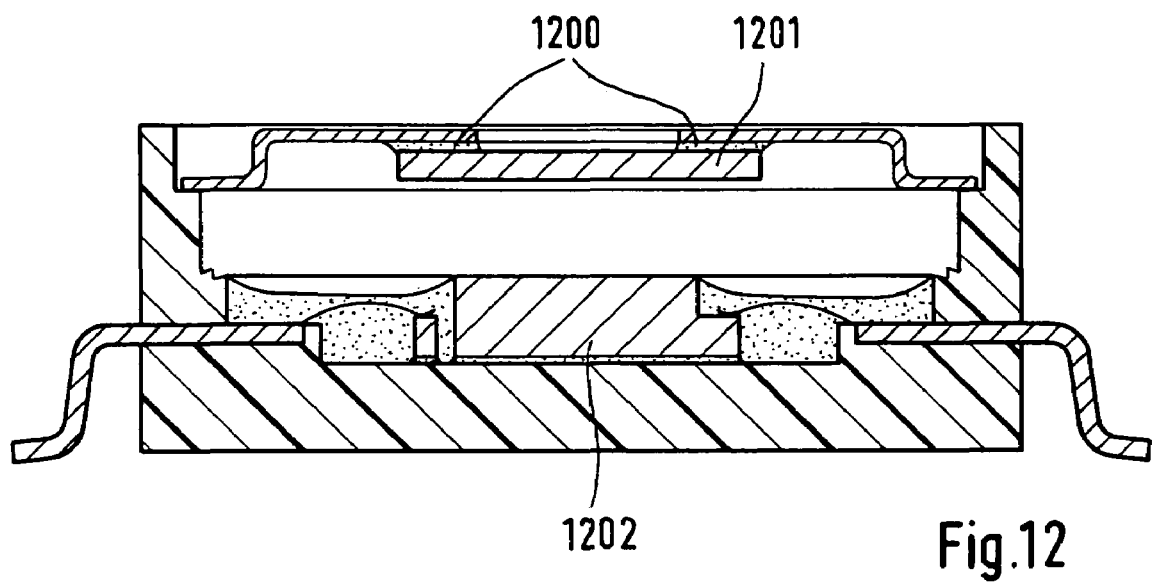
FIG. 12 shows the option of integrating further, external filters in the premold housing.

FIG. 12 shows an example of the mounting of an external filter to the metal cover. In this context, 1201 denotes the optical filter, which is attached to the metal cover via adhesive connections 1200. Reference numeral 1202 denotes the chip assembly.

The design of the premolded housing must be adapted to the chip assembly, i.e. the stopping edge running around the inner wall of the housing must be adapted to the overall chip height of a stepped chip assembly.

It has been shown that, after the mounting of the sensor chips, the height of the wire-bonding surfaces on the side of the housing should be advantageously less than the height of the wire-bonding surfaces on the side of the chip. This advantageous height difference may also be produced by mounting a base under the chips (e.g. by adhesively bonding a silicon or glass plate).

The term "stepped chip assembly" is understood to mean that a step is present on at least one side of the chip assembly. The bonding contacts are situated on this step.

The chip or chips are subsequently mounted in the premold housing (e.g. adhesively bonded or, in the event of a suitable chip-mounting surface, soldered) and contacted or wire-bonded, using wires.

The maximum height of the bonding loops, i.e. the distance of the "highest" point of a wire bond above the base of the housing, is of high importance to the functioning of the passivation. This maximum height of the vertex of the wire shape must be significantly less than the height of the upper chip surface in a stepped chip assembly, i.e. the bonding wires must be led away from the chip in as flat a manner as possible, in order that they are completely covered by passivation material.

A metal cover having openings adapted to the size of the active (in the example, optical) chip surface is installed as a mechanical protection for the bonding wires and the passivation. This offers, as an additional advantage, the simple, further mounting of the housing by standard, component-insertion machines, and is used for providing shielding from scattered radiation.

This opening (in the case of one chip in the housing) or openings (in the case of several chips) should preferably be placed symmetrically (in the case of several openings, axially symmetrically) in this metal cover. The metal cover is crimped to the housing by plastically deforming the housing edge. The presence of this metal cover allows the option of mounting external filters. Thus, using the same structural design, and by varying the external filters, it would be possible to detect different gases, e.g. carbon dioxide, nitrogen oxides, or methane gas.

Figure 13:
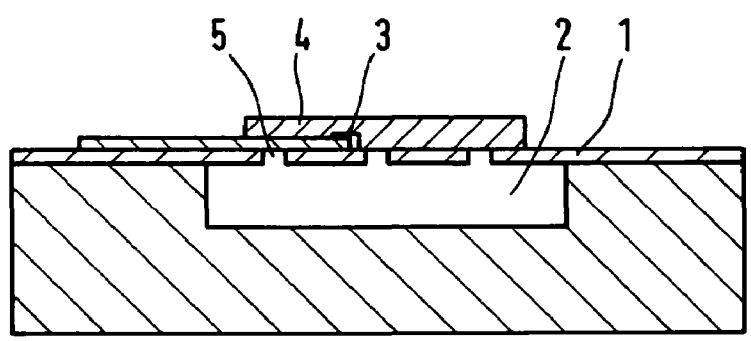
FIG. 13 shows an exemplary embodiment of the chip assembly.

The chip assembly, as is shown in an exemplary embodiment represented in FIG. 13, will now be discussed in detail.

A temperature sensor 3, e.g. a thermopile, which is based on the physical Seebeck effect, is situated on a thermally insulating diaphragm 1, which is exposed by a cavity 2. Cavity 2 contains a vacuum and is used to thermally isolate thermopile 3. In order to determine the intensity of IR radiation, an IR-absorbing layer 4 must be locally deposited over self-supporting diaphragm 1. When diaphragm 1 has perforation holes 5, or is very thin and has, therefore, little mechanical rigidity, this deposition process must be carried out very carefully. Perforation holes 5 are necessary for producing cavity 2 with the aid of an etching process.

In this context, IR-absorbing layer 4 should be highly absorbent in the wavelength range of 1 µm to 5 µm. It preferably has a thermal conductivity, which lies in the range of the heat conduction of nitrides or oxides. The layer thickness should preferably not exceed 10 µm to a considerable extent.

Finally, it should be pointed out that the exemplary embodiments always relate to one premold housing, which contains two sensors. Of course, the described set-up may also be expanded to include set-ups having only one or more than two sensors in the premold housing.

What is claimed is:

1. A device for detecting incident infrared radiation, comprising:
    at least one chip assembly for detecting infrared radiation;
    at least one bonding wire that starts out from the at least one chip assembly and runs through electrically conductive terminals to an exterior of a housing;
    passivation material that is distributed in such a manner that the at least one bonding wire is completely enclosed by the passivation material, wherein:
        a surface region of the at least one chip assembly faces the incident infrared radiation and is not covered by the passivatiom material; and
    a preformed housing within which the at least one chip assembly is accommodated, wherein the preformed housing includes a geometric structure that runs around at least part of an inner wall of the preformed housing and is shaped in such a manner that the geometric structure is not traversed by the passivation material as a result of passivation-material creep caused by one of wetting forces and adhesion forces between the passivation material and the inner wall of the preformed housing, the passivation-material creep leading away from a base of the preformed housing.

2. The device as recited in claim 1, wherein:
the passivation material includes a passivation gel, and the geometric structure is a gel stopping edge.

3. The device as recited in claim 1, wherein:
a radial cross-section of the geometric structure has at least one acute angle.

4. The device as recited in claim 1, wherein:
a radial cross-section of the geometric structure has at least one angle, upon traversal of which the passivation material travels around an angle greater than 270 degrees.

5. The device as recited in claim 1, further comprising:
a metal cover having at least one opening, wherein:
    the preformed housing is open to one side, and
    the open side of the preformed housing is occluded by the metal cover.

6. The device as recited in claim 5, wherein:
the metal cover and the at least one chip assembly are positioned in such a manner that the incident infrared radiation initially passes through the at least one opening of the metal cover and subsequently reaches the surface region of the chip assembly not covered by the passivation material.

7. The device as recited in claim 6, further comprising:
a filter assigned to the at least one opening of the metal cover, wherein:
    the filter permits therethrough only infrared radiation in a predefined wavelength range.

8. The device as recited in claim 1, further comprising:
at least two chip superstructures for detecting infrared radiation, wherein:
    in each of the at least two chip superstructures, the surface region of the chip assembly facing the incident, infrared radiation is not covered by the passivation material.

9. The device as recited in claim 1, wherein:
the at least one chip assembly includes at least one thermopile.

10. The device as recited in claim 9, further comprising:
a self-supporting diaphragm that covers at least one cavity of the at least one chip assembly, wherein:
    the thermopile is attached to a side of the diaphragm opposite to the at least one cavity.

11. A device for detecting incident infrared radiation, comprising:
    at least one chip assembly for detecting infrared radiation;
    at least one bonding wire that starts out from the at least one chip assembly and runs through electrically conductive terminals to an exterior of a housing;
    passivation material that is distributed in such a manner that the at least one bonding wire is completely enclosed by the passivation material; wherein a surface region of the at least one chip assembly faces the incident infrared radiation and is not covered by the passivation material;

a preformed housing within which the at least one chip assembly is accommodated;

a metal cover having at least one opening, wherein the preformed housing is open to one side, and the open side of the preformed housing is occluded by the metal cover, wherein the metal cover and the at least one chip assembly are positioned in such a manner that the incident infrared radiation initially passes through the at least one opening of the metal cover and subseciuently reaches the surface region of the chip assembly not covered by the passivation material; and a filter assigned to the at least one opening of the metal cover, wherein the filter permits therethrough only infrared radiation in a predefined wavelength range, wherein:
the filter includes a Fabry-Perot filter, and
the filter only transmits infrared radiation in a wavelength range about an absorption band of a gas to be detected.

12. The device as recited in claim 11, wherein: the gas to be detected is carbon dioxide.

13. A device for detecting incident infrared radiation, comprising:

at least one chip assembly for detecting infrared radiation;

at least one bonding wire that starts out from the at least one chip assembly and runs through electrically conductive terminals to an exterior of a housing;

passivation material that is distributed in such a manner that the at least one bonding wire is completely enclosed by the passivation material, wherein a surface region of the at least one chip assembly faces the incident infrared radiation and is not covered by the passivation material;

at least two chip superstructures for detecting infrared radiation, wherein in each of the at least two chip superstructures, the surface region of the chip assembly facing the incident, infrared radiation is not covered by the passivation material; and at least two Fabry-Perot filters, wherein:
at least one of the filters only transmits infrared radiation in a wavelength range about an absorption band of a gas to be detected, and
at least one other of the filters only transmits infrared radiation in a wavelength range different from the wavelength range about the absorption band of the gas to be detected.

14. The device as recited in claim 13, wherein:
the gas to be detected is carbon dioxide.

* * * * *